US010381538B2

(12) United States Patent
Hayashi

(10) Patent No.: US 10,381,538 B2
(45) Date of Patent: Aug. 13, 2019

(54) LIGHT EMITTING DEVICE HAVING FLUORESCENT AND LIGHT SCATTERING LIGHT-TRANSMISSIVE MEMBER

(71) Applicant: NICHIA CORPORATION, Anan-shi, Tokushima (JP)

(72) Inventor: Hirosuke Hayashi, Naruto (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/876,517

(22) Filed: Jan. 22, 2018

(65) Prior Publication Data

US 2018/0212128 A1   Jul. 26, 2018

(30) Foreign Application Priority Data

Jan. 24, 2017 (JP) ................................. 2017-010533

(51) Int. Cl.
*H01L 33/64* (2010.01)
*H01L 33/50* (2010.01)
(Continued)

(52) U.S. Cl.
CPC .......... *H01L 33/644* (2013.01); *G02B 6/0003* (2013.01); *H01L 33/507* (2013.01);
(Continued)

(58) Field of Classification Search
CPC ..... H01L 33/644; H01L 33/507; H01L 33/58; H01L 33/60; H01L 33/62; G02B 6/0003
See application file for complete search history.

(56) References Cited

U.S. PATENT DOCUMENTS 6,791,116 B2 * 9/2004 Takahashi ............. H01L 33/508
257/100
7,309,881 B2 * 12/2007 Sato ....................... H01L 33/501
257/100
(Continued)

FOREIGN PATENT DOCUMENTS

JP    2010004035 A  *  1/2010
JP    2012-156180 A     8/2012
(Continued)

*Primary Examiner* — Ida M Soward
(74) *Attorney, Agent, or Firm* — Global IP Counselors, LLP

(57) ABSTRACT

A light emitting device includes a light emitting element, a light-transmissive member, a light guide member and a light reflective member. The light-transmissive member includes a first region directly above a top surface of the light emitting element, and a second region at a lateral side of the first region. The light guide member covers a lateral surface of the light emitting element and a bottom surface of the second region of the light-transmissive member. The light reflective member covers an outer surface of the light guide member. The light-transmissive member contains a fluorescent substance and a light scattering material that is not a fluorescent substance. A concentration of the fluorescent substance in the light-transmissive member is higher in the first region than in the second region. A concentration of the light scattering material in the light-transmissive member is higher in the second region than in the first region.

11 Claims, 8 Drawing Sheets

(51) Int. Cl.
- *H01L 33/58* (2010.01)
- *H01L 33/60* (2010.01)
- *H01L 33/62* (2010.01)
- *G02B 6/00* (2006.01)
- *F21V 8/00* (2006.01)
- *H01L 33/32* (2010.01)
- *H01L 33/54* (2010.01)

(52) U.S. Cl.
CPC ............ *H01L 33/508* (2013.01); *H01L 33/58* (2013.01); *H01L 33/62* (2013.01); *H01L 33/32* (2013.01); *H01L 33/54* (2013.01); *H01L 33/60* (2013.01); *H01L 2933/005* (2013.01); *H01L 2933/0041* (2013.01); *H01L 2933/0058* (2013.01); *H01L 2933/0075* (2013.01); *H01L 2933/0091* (2013.01)

(56) References Cited

U.S. PATENT DOCUMENTS

| | | | |
|---|---|---|---|
| 7,391,046 B2 * | 6/2008 | Tsutsumi | C09K 11/02 257/13 |
| 7,605,405 B2 * | 10/2009 | Harada | H01L 33/44 257/100 |
| 7,834,541 B2 * | 11/2010 | Cok | B82Y 20/00 313/110 |
| 8,035,122 B2 * | 10/2011 | Kim | H01L 33/56 257/100 |
| 8,803,422 B2 * | 8/2014 | Miyairi | H01L 25/0753 313/512 |
| 8,835,951 B2 * | 9/2014 | Ichikawa | H01L 24/32 257/98 |
| 8,872,210 B2 * | 10/2014 | Furuyama | H01L 33/501 257/40 |
| 9,502,623 B1 * | 11/2016 | Miyamoto | H01L 25/167 |
| 2006/0099449 A1 * | 5/2006 | Amano | C09K 11/06 428/690 |
| 2006/0193121 A1 * | 8/2006 | Kamoshita | H01L 33/508 362/84 |
| 2010/0084962 A1 * | 4/2010 | Winkler | C09K 11/7774 313/484 |
| 2011/0309388 A1 | 12/2011 | Ito et al. | |
| 2012/0140506 A1 | 6/2012 | Waragawa et al. | |
| 2012/0326180 A1 * | 12/2012 | Ohe | H01L 27/322 257/88 |
| 2015/0008470 A1 * | 1/2015 | Furuyama | H01L 33/501 257/98 |
| 2015/0236230 A1 * | 8/2015 | Miyata | H01L 33/62 257/98 |
| 2015/0263243 A1 * | 9/2015 | Nakagawa | H01L 33/504 257/98 |
| 2016/0111610 A1 | 4/2016 | Ota et al. | |
| 2016/0351762 A1 | 12/2016 | Sato | |
| 2016/0351766 A1 | 12/2016 | Hayashi et al. | |

FOREIGN PATENT DOCUMENTS

| | | |
|---|---|---|
| JP | 2012-186337 A | 9/2012 |
| JP | 2013-168602 A | 8/2013 |
| JP | 2014-063832 A | 4/2014 |
| JP | 2014-072309 A | 4/2014 |
| JP | 2015-115480 A | 6/2015 |
| JP | 2015-228389 A | 12/2015 |
| JP | 2016-082212 A | 5/2016 |
| JP | 2016-213219 A | 12/2016 |
| JP | 2016-225514 A | 12/2016 |
| JP | 2016-225515 A | 12/2016 |

* cited by examiner

LIGHT EMITTING DEVICE HAVING FLUORESCENT AND LIGHT SCATTERING LIGHT-TRANSMISSIVE MEMBER

CROSS REFERENCE TO RELATED APPLICATIONS

This application claims priority to Japanese Patent Application No. 2017-010533, filed on Jan. 24, 2017. The entire disclosure of Japanese Patent Application No. 2017-010533 is hereby incorporated herein by reference.

TECHNICAL FIELD

The present disclosure relates to a light emitting device and a method for manufacturing the same.

BACKGROUND ART

For example, in Japanese Laid-Open Patent Application Publication No. 2015-115480, a light emitting device is described that includes: a blue LED element in which a negative electrode and a positive electrode are formed on a bottom surface thereof; a phosphor layer disposed on a top surface of the LED element to emit white light as a whole; reversed square pyramid shaped transparent resin parts disposed on lateral surfaces of the LED element and having a bottom surface on which the phosphor layer is disposed; and a reflecting wall covering exposed surfaces, which are surfaces other than the bottom surface of the LED element and the top surface of the phosphor layer.

SUMMARY

In the light emitting device described in Japanese Laid-Open Patent Application Publication No. 2015-115480 described above, a portion of the phosphor layer in a region directly above the transparent resin part has heat dissipation performance lower than heat dissipation performance of a portion of the phosphor layer in a region directly above the LED element, and thus is easily degraded. However, if the phosphor in this region is removed, light emitted from the LED element is emitted toward obliquely above the light emitting device without being mixed with light from the phosphor, so that great unevenness in emission color distribution may be occurred.

In light of that, one object of one embodiment of the present invention is to provide a light emitting device in which heat in a fluorescent substance can be easily dissipated and unevenness in the light emission color distribution can be reduced. Also, one object of another embodiment of the present invention is to provide a method of manufacturing such a light emitting device with good productivity.

A light emitting device according to one embodiment of the present invention includes a light emitting element, a light-transmissive member, a light guide member and a light reflective member. The light-transmissive member is disposed above the light emitting element. The light-transmissive member includes a first region directly above a top surface of the light emitting element and a second region at a lateral side of the first region. The light guide member covers a lateral surface of the light emitting element and a bottom surface of the second region of the light-transmissive member. The light reflective member covers an outer surface of the light guide member. The light-transmissive member contains a fluorescent substance and a light scattering material that is not a fluorescent substance. A concentration of the fluorescent substance in the light-transmissive member is higher in the first region than in the second region. A concentration of the light scattering material in the light-transmissive member is higher in the second region than in the first region.

A method for manufacturing a light emitting device according to another embodiment of the present invention includes: providing a light-transmissive member, the light-transmissive member including a first region and a second region at a lateral side of the first region, above a light emitting element so that the a first region of the light-transmissive member is positioned directly above a top surface of the light emitting element and a lateral surface of the light emitting element and a bottom surface of the second region of the light-transmissive member are covered by a light guide member; and covering an outer surface of the light guide member with a light reflective member. The light-transmissive member contains a fluorescent substance and a light scattering material that is not a fluorescent substance. A concentration of the fluorescent substance in the light-transmissive member is higher in the first region than in the second region. A concentration of the light scattering material in the light-transmissive member is higher in the second region than in the first region.

According to certain embodiments of the present invention, it is possible to obtain a light emitting device in which heat in the fluorescent substance can be easily dissipated and unevenness in the light emission color distribution can be reduced. Also, according to another certain embodiments of the present invention, it is possible to manufacture such a light emitting device with good productivity.

DETAILED DESCRIPTION OF THE EMBODIMENTS

Figure 1A:
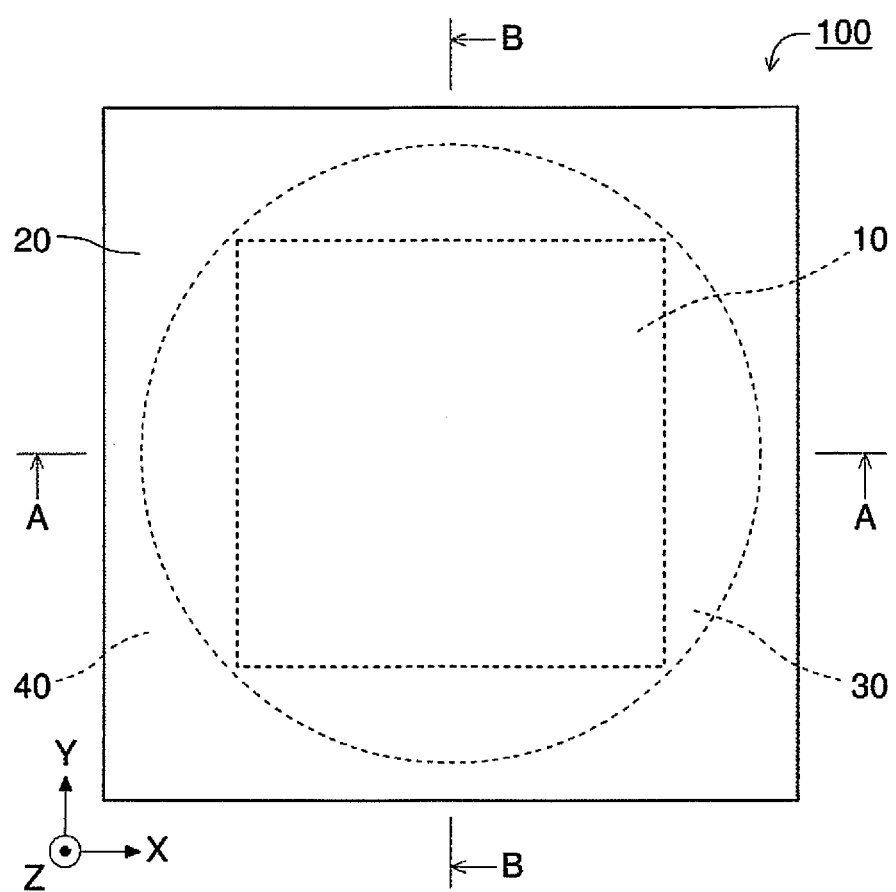
FIG. 1A is a schematic top view of a light emitting device according to a first embodiment of the present invention.

Hereafter, certain embodiments of the present invention will be explained with reference to the drawings as appropriate. The light emitting device and the method of manufacturing the same explained hereafter are intended to give a concrete form to the technical idea of the present invention, and unless specifically described otherwise, the present invention is not limited to the description below. Also, description in one embodiment may also be applied to another embodiment. The size, positional relationship, etc., of the members shown in the drawings may be exaggerated for ease of explanation.

In the drawings, a width direction of the light emitting device is referred to as an "X direction", a depth direction of the light emitting device is referred to as an "Y direction", and an upper-lower (i.e., thickness) direction of the light emitting device is referred to as a "Z direction". Each of the X, Y, and Z directions (i.e., axes) is a direction (i.e., axes) perpendicular to the other two directions (i.e., axes) of the X, Y, and Z directions. In more detail, a rightward direction is referred to as an "X+ direction", a leftward direction is referred to as an "X− direction", a backward direction is referred to as a "Y+ direction", a frontward direction is referred to as a "Y− direction", an upward direction is referred to as a "Z+ direction", and a downward direction is referred to as a "Z− direction". A principal light emitting direction of the light emitting device is the upward direction. A lateral direction refers to, for example, a direction parallel to a plane extending in the width direction and the depth direction, specifically, the XY plane.

Also, a "wavelength range of visible light" refers to a wavelength range of 380 nm to 780 nm, a "blue light range" refers to a wavelength range of 420 nm to 480 nm, a "green light range" refers to a wavelength range of 500 nm to 560 nm, a "yellow light range" refers to a wavelength range of longer than 560 nm and 590 nm or less, and a "red light range" refers to a wavelength range of 610 nm to 750 nm.

Further, the expression "light-transmissive" as used in the present specification refers to having light transmittance of 60% or greater, more preferably 70% or greater, and even more preferably 80% or greater with respect to light with emission peak wavelength of the light emitting element. The expression "light reflective" as used in the present specification refers to having a light reflectance of 60% or greater, more preferably 70% or greater, and even more preferably 80% or greater with respect to light with the light emission peak wavelength of the light emitting element is.

First Embodiment

Figure 1B:
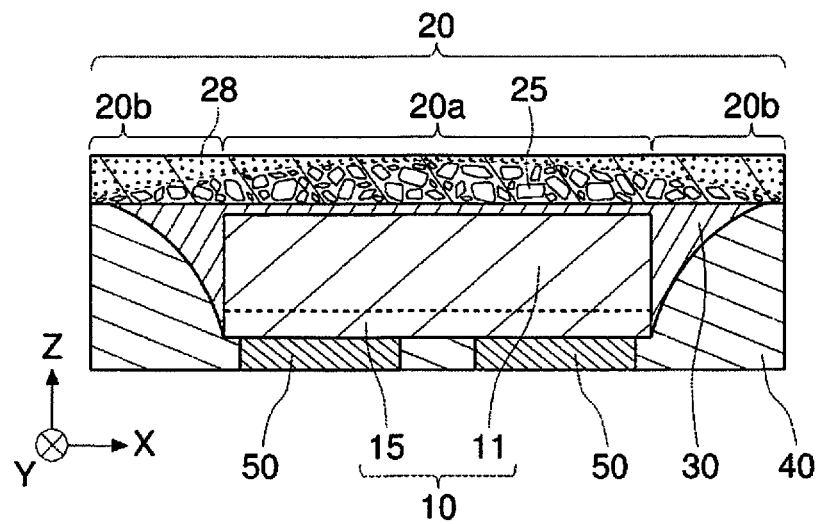
FIG. 1B is a schematic cross sectional view of the light emitting device taken along a line A-A in FIG. 1A.
Figure 1C:
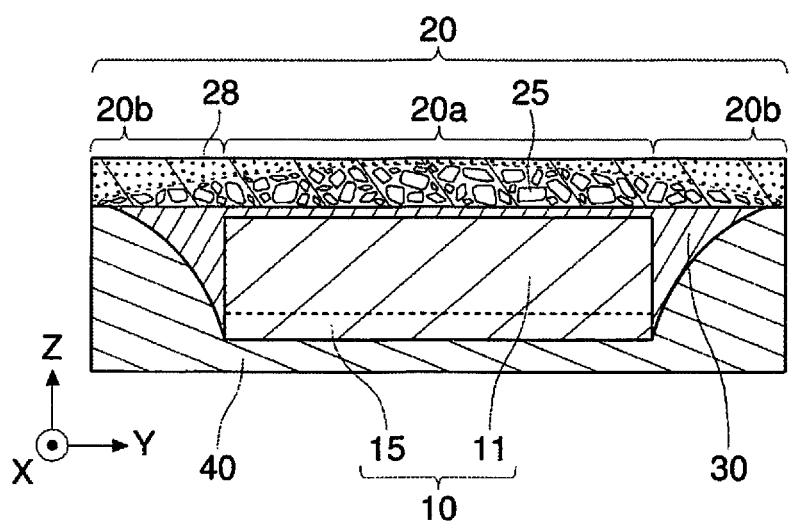
FIG. 1C is a schematic cross sectional view of the light emitting device taken along a line B-B in FIG. 1A.

FIG. 1A is a schematic top view of a light emitting device 100 according to the first embodiment of the present invention. FIG. 1B is a schematic cross sectional view of the light emitting device 100 taken along a line A-A in FIG. 1A. FIG. 1C is a schematic cross section view of the light emitting device 100 taken along a line B-B in FIG. 1A.

As shown in FIG. 1A to 1C, the light emitting device 100 of the first embodiment includes a light emitting element 10, a light-transmissive member 20, a light guide member 30, and a light reflective member 40. The light-transmissive member 20 is placed above the light emitting element 10. The light-transmissive member 20 comprises a first region 20a positioned directly above a top surface of the light emitting element 10, and a second region 20b at a lateral side of the first region 20a. The light guide member 30 covers the side surface of the light emitting element 10 and a bottom surface of the second region 20b of the light-transmissive member. The light reflective member 40 covers the outer surface of the light guide member 30. The light-transmissive member 20 contains a fluorescent substance 25, and a light scattering material 28 that is not a fluorescent substance. Also, the concentration of the fluorescent substance 25 is higher in the first region 20a than in the second region 20b. Further, the concentration of the light scattering material 28 is higher in the second region 20b than in the first region 20a.

In the light emitting device 100 having such a configuration, with the concentration of the fluorescent substance 25 in the light-transmissive member 20 higher in the first region 20a than in the second region 20b, heat emitted by the fluorescent substance 25 is easily drawn via the light emitting element 10, which has relatively high thermal conductivity, and heat generation and heat retention in the second region 20b can be reduced. Thus, degradation of the second region 20b due to heat can be reduced. Accordingly, degradation of the light guide member 30 that is adjacent to the second region 20b can be reduced. Thus, it is possible to increase the reliability of the light emitting device 100. Also, in the light emitting device 100, with the concentration of the light scattering material 28 in the light-transmissive member 20 higher in the second region 20b than in the first region 20a, the light emitted from the light emitting element 10 is more easily scattered in the second region 20b, the directivity of light of the light emitting element 10 in the obliquely-upward direction of the light emitting device is reduced, and thus unevenness in the light emission color distribution can be reduced. Also, light scattering due to the light scattering material 28 allows for increasing incident of light emitted from the light emitting element 10 to be incident on the fluorescent substance 25, so that relatively high wavelength conversion rate in the second region 20b, in which the concentration of the light scattering material 28 in increased, contributes to reduction of unevenness in the light emission color distribution. Furthermore, with the light scattering material 28, thermal conductivity of the second region 20b may be increased. The light scattering material 28 is not a fluorescent substance, so that heat generation thereof is small, and thus does not easily cause degradation of the second region 20b due to heat even with a high concentration. Therefore, the light emitting device 100 can be a light emitting device in which heat can be easily drawn from the fluorescent substance 25 and unevenness of the light emission color distribution can be reduced.

The concentration of the fluorescent substance 25 and the light scattering material 28 is preferably a volumetric concentration from the perspective of its action. This is similar in the concentration of a second fluorescent substance 26 described below.

Also, as shown in FIG. 1A, in the first embodiment, the light-transmissive member 20 has a rectangular shape in a top view, and the light guide member 30 has a circular shape in a top view. With such shapes, the second region 20b has a region directly above the light guide member 30, and a region at a lateral side of that and directly above the light reflective member 40. Light with the high radiant flux emitted from light emitting element 10 is incident on the region directly above the light guide member 30 through the light guide member 30, which can facilitate light emission of the fluorescent substance 25. Also, generally, the light reflective member 40 contains a large amount of pigment, etc. for providing light reflectivity, and has a thermal conductivity higher than that of the light guide member 30 that requires high light-transmissivity. Accordingly, in the second region 20*b*, in particular in the region directly above the light guide member 30, temperature is easily increased and thus degradation occurs easily. Therefore, the region in the second region 20*b* where temperature is easily increased is in accordance with an area covered by the light guide member 30 on a lower surface of the second region 20*b*.

Also, in view of uniformity of heat dissipation and light emission color distribution, it is preferable that the center of the light emitting element 10 in the top view substantially corresponds to the center of the light-transmissive member 20 in the top view. When the center of the light emitting element 10 in the top view and the center of the light-transmissive member 20 in the top view are separated from each other, the separation distance therebetween is preferably a half or less, more preferably a quarter or less of the minimum width of the second region 20*b* when the center of the light emitting element 10 in the top view corresponds to the center of the light-transmissive member 20 in the top view. In the case where a plurality of light emitting elements are connected to a single light-transmissive member, the center of a virtual shape formed by connecting an outermost periphery of the plurality of light emitting elements in the top view can be regarded as the center of the light emitting elements in the top view.

Hereafter, a detailed description is given of preferred embodiments of the light emitting device 100.

The light scattering material 28 can realize Rayleigh scattering, which can greatly increase scattering intensity of short wavelength light, so that scattering of the light of the light emitting element 10 in the second region 20*b* is effectively obtained, and it is easier to reduce unevenness in the light emission color distribution of the light emitting device 100. Therefore, the average particle diameter of the light scattering material 28 is preferably smaller than the light emission peak wavelength of the light emitting element 10, more preferably is ⅕ or less of the light emission peak wavelength of the light emitting element 10, and even more preferably is 1/10 or less of the light emission peak wavelength of the light emitting element 10. More specifically, the average particle diameter of the light scattering material 28 is preferably smaller than 500 nm, more preferably smaller than 100 nm, and even more preferably smaller than 50 nm. The average particle diameter of the light scattering material 28 is, for example, 1 nm or greater. This average particle diameter is preferably a primary particle diameter, but aggregation of the particles may not be ignored, and may be a secondary particle diameter. The average particle diameter can be defined by $D_{50}$. Also, the average particle diameter can be measured using an image analysis method (e.g., scanning electron microscopy (SEM), transmission electron microscopy (TEM)), a laser diffraction and scattering method, a dynamic light scattering method, a small angle X-ray scattering method, etc. Among these, in view of measurement of the particle diameter of particles that is present in a member, an image analysis method is preferable. The image analysis method conforms to JISZ8827-1: 2008, for example.

As shown in FIGS. 1B and 1C, with the light emitting device 100 of the first embodiment, the concentration of the fluorescent substance 25 is lowest at the side end part of the second region 20*b*, and is highest at the center part of the first region 20*a*. In the light-transmissive member 20, toward lateral ends thereof, in other words, toward the lateral surfaces thereof, the light path length from the light emitting element 10 is increased, and thus also the wavelength conversion rate of the light emitted from the light emitting element 10 due to the fluorescent substance 25 is increased easily. Also, toward the lateral surfaces the light-transmissive member 20, the distance from the light emitting element 10 is increased, and thus the heat dissipation is decreased easily. Therefore, with the fluorescent substance 25 distributed at a low concentration at the lateral end part of the second region 20*b*, and at a high concentration at the center part of the first region 20*a*, unevenness in the light emission color distribution is easily reduced, and heat is easily drawn from the fluorescent substance 25. In particular, in the example shown in FIGS. 1B and 1C, the fluorescent substance 25 is disposed over the center part of the first region 20*a* and the lateral end part of the second region 20*b*. In more detail, the fluorescent substance 25 is continuously between the center part of the first region 20*a* and the lateral end part of the second region 20*b*. Also, the concentration of the fluorescent substance 25 is gradually increased from the lateral end of the second region 20*b* to the center of the first region 20*a*. The expression "center part" of the first region 20*a* includes a region at a distance of 5% or less of the maximum width of the light-transmissive member 20 (e.g., if a top view shape of the light-transmissive member 20 is a rectangular shape, a length of a diagonal line of the rectangular shape) from the center of the first region 20*a*. Also, the expression "lateral end part" of the second region 20*b* includes a region at a distance of 5% or less of the maximum width of the light-transmissive member 20 (e.g., if a top view shape of the light-transmissive member 20 is a rectangular shape, a length of the diagonal line of the rectangular shape) from the lateral end of the second region 20*b*.

As shown in FIGS. 1B and 1C, in the light emitting device 100 of the first embodiment, the concentration of the light scattering member 28 is lowest at the center part of the first region 20*a*, and is highest at the side end part of the second region 20*b*. With the light scattering member 28 distributed inside the light-transmissive member 20 with a concentration relationship inverse to the fluorescent substance 25, it is possible to increase the uniformity of the scattering and/or the wavelength conversion rate of the light of the light emitting element 10 in the light-transmissive member 20, and it is easy to reduce unevenness in the light emission color distribution. In particular, in the example shown in FIGS. 1B and 1C, the light scattering member 28 is disposed at the center part of the first region 20*a* and the lateral end part of the second region 20*b*. In more detail, the light scattering member 28 is disposed continuously from the center part of the first region 20*a* to the side end part of the second region 20*b*. Then, the concentration of the light scattering material 28 is gradually increased from the center of the first region 20*a* to the lateral end of the second region 20*b*.

As shown in FIGS. 1B and 1C, in the light emitting device 100 of the first embodiment, the light guide member 30 does not contain a fluorescent substance. This allows for reducing heat generation in the light guide member 30. Therefore, it is possible to facilitate drawing heat generated by the fluorescent substance 24, particularly the heat in the second region 20b, via the light guide member 30. Also, reduction in degradation of the light guide member 30 can be expected.

As shown in FIGS. 1B and 1C, the light emitting element 10 includes a light-transmissive substrate 11 and a semiconductor layered body 15. Also, the top surface of the light emitting element 10 is a surface of the substrate 11. In the light emitting element 10, light and heat is generated from the semiconductor layered body 15, and has a thickness of approximately several micrometers, which is relatively small. Accordingly, with the substrate 11 disposed between the semiconductor layered body 15 and the light-transmissive member 20, the light emitted from the semiconductor layered body 15 propagates inside the substrate 11 and appropriately expands laterally, so that preferable light distribution for the light-transmissive member 20 which has the second region 20b, and thus reduction in unevenness of the light emission color distribution can be facilitated. Also, with the light-transmissive member 20 disposed distant from the semiconductor layered body 15, the effect of intense light and great heat emitted by the semiconductor layered body 15 is reduced, so that degradation of the light-transmissive member 20 can be reduced.

As shown in FIGS. 1B and 1C, electrodes 50 are disposed on the bottom surface of the light emitting element 10. Then, the electrodes 50 configure a portion of the bottom surface of that light emitting device 100. Such a light emitting device 100 is called, for example, "a chip size package (CSP) type", and can be formed to be smaller than the PLCC (Plastic Leaded Chip Carrier) type. The electrodes 50 are made of a metal material, are terminals for supplying power to the light emitting element 10, and are also functions to dissipate heat in the light emitting device 100. In the light emitting device 100 of a small size, distance between the heat generating part and the electrodes 50 can be reduced, which allows for increasing heat dissipation via the electrodes 50.

Method of Manufacturing Light Emitting Device 100

The method for manufacturing the light emitting device 100 of the first embodiment includes providing the light-transmissive member 20, that includes the first region 20a directly above the top surface of the light emitting element 10 and the second region 20b at a lateral side of the first region 20a, above the light emitting element 10, in which the lateral surfaces of the light emitting element 10 and the bottom surface of the second region 20b of the light-transmissive member are covered by the light guide member 30 (i.e., first step); and covering the outer surface of the light guide member 30 with the light reflective member 40 (i.e., second step). The light-transmissive member 20 contains the fluorescent substance 25, and the light scattering member 28 which is not a fluorescent substance, where the concentration of the fluorescent substance 25 is higher in the first region 20a than in the second region 20b and the concentration of the light scattering material 28 is higher in the second region 20b than in the first region 20a.

In the method of manufacturing the light emitting device 100 having such a configuration, the light-transmissive member 20 can be provided in which distribution of the fluorescent substance 25 and the light scattering member 28 is appropriately controlled, and the light-transmissive member 20, the light emitting element 10, and the light guide member 30 can be connected with a preferable relationship. Therefore, the light emitting device 100 in which heat is easily drawn from the fluorescent substance 25 and unevenness in the light emission color distribution reduced can be manufactured with good productivity.

FIGS. 2A, 2B, 2C, and 2D are schematic cross sectional views illustrating a first stage, second stage, third stage, and fourth stage, respectively, of the method of manufacturing the light emitting device 100 of the first embodiment. Here, the first step includes the first stage and the second stage, and the second step includes the third stage. As described hereafter, the light emitting device 100 of the first embodiment can be manufactured with better productivity by fabricating a light emitting device collective body 150, and by dividing that light emitting device collective body 150.

Figure 2A:
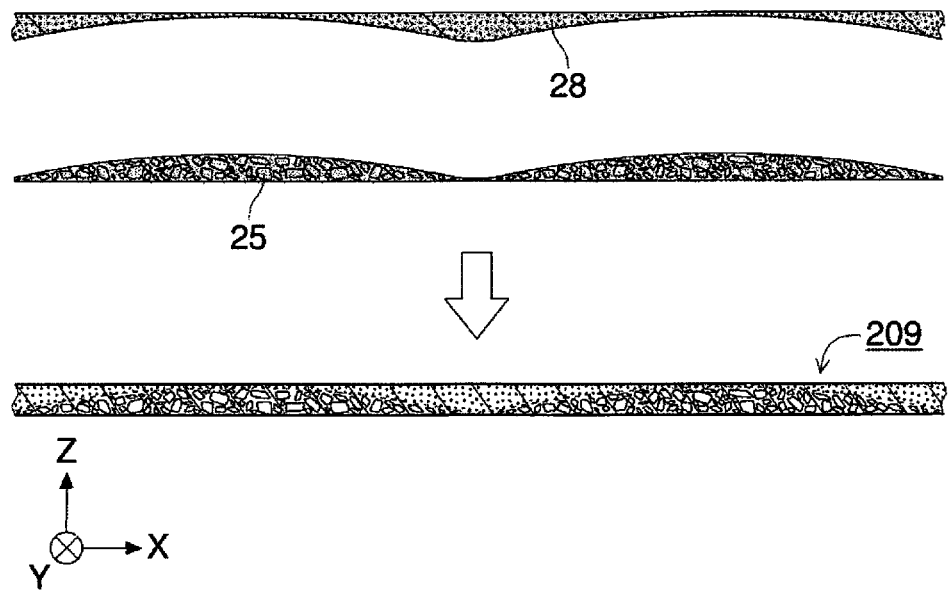
FIG. 2A is a schematic cross sectional view showing one stage of the method of manufacturing a light emitting device according to the first embodiment of the present invention.

As shown in FIG. 2A, the first stage is the stage for providing the light-transmissive member 20. More specifically, the light-transmissive member 20 is obtained, for example, by forming a sheet member 209 that contains the fluorescent substance 25 and the light scattering member 28, and then dividing that sheet member 209. In other words, this sheet member 209 is a collective body of light-transmissive members 20. At the first stage of this the first embodiment, the light-transmissive member 20 is provided as a portion of the sheet member 209. To form the sheet member 209, either or both of a first element sheet containing the fluorescent substance 25 and a second element sheet containing the light scattering material 28 is preferably formed in advance. In this manner, distribution of the fluorescent substance 25 and the light scattering material 28 can be suitably controlled in the sheet member 209, and thus in the light-transmissive member 20, which can facilitate providing the light-transmissive member 20 with good productivity. In particular, it is preferable that the first and second element sheets be formed using a metal mold. This can facilitate suitably controlling the distribution of the fluorescent substance 25 and the light scattering material 29 within the sheet member 209, and thus in the light-transmissive member 20, which allows for easily providing the light-transmissive member 20 with better productivity. Also, when bonding the first and second element sheets, the main material of at least one (preferably both) of the first and second element sheets is preferably in a state of not being completely hardened or solidified, in view of reducing bonding strength of the element sheets and/or distortion in the sheet member 209. Also, in view of the same, it is preferable that the boundary, in other words, the interface, between the first and second element sheets bonded with the sheet member 209 is not observed, but the boundary may be observed. The expression "a state of not completely hardened or solidified" refers to a state where the hardening or solidifying has progressed to some degree, and for example, is a state called semi-hardened, B stage, gel form, or semi-solidified. Also, the first and second element sheets are not limited to a shape with undulations as shown in FIG. 2A, and the shape can be selected appropriately as long as a predetermined distribution of the fluorescent substance 25 and the light scattering material 28 can be obtained after bonding.

Figure 2B:
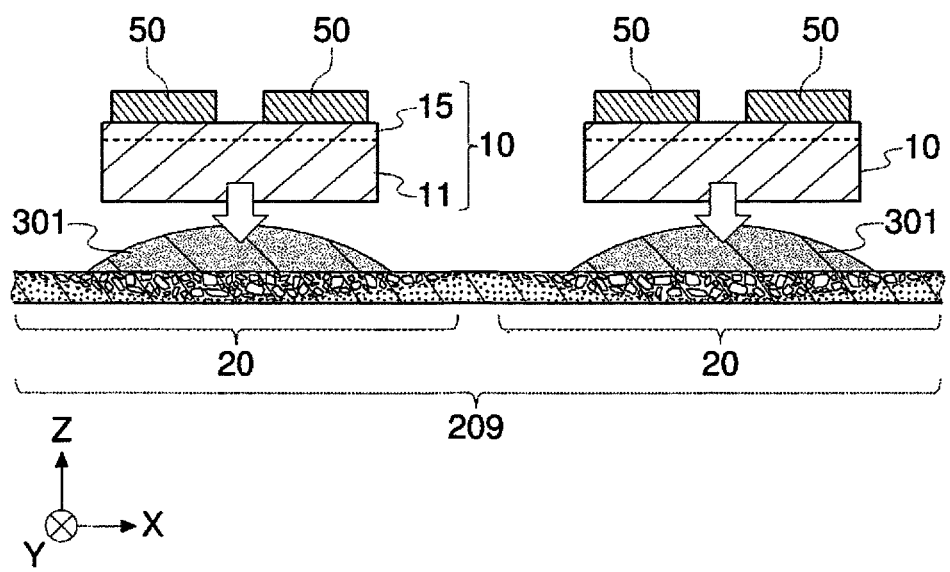
FIG. 2B is a schematic cross sectional view showing one stage of the method of manufacturing a light emitting device according to the first embodiment of the present invention.

As shown in FIG. 2B, the second stage is a stage for providing the light-transmissive member 20 above the light emitting element 10 via the light guide member 30. More specifically, first, a light guide member liquid material 301 is applied on one or both of the light emitting element 10 and the light-transmissive member 20 (in the first embodiment, the sheet member 209). Then, after the light emitting element 10 and the light-transmissive member 20 are connected via the light guide member liquid material 301, the light guide member liquid material 301 is hardened or solidified. When the light guide member liquid material 301 is applied on the light-transmissive member 20, after applying the light guide member liquid material 301 on a region of the light-transmissive member 20 containing a high concentration of the fluorescent substance 25, which will become the first region 20a, the main light emitting surface (i.e., a surface that will later become the top surface) of the light emitting element 10 is connected to the light guide member liquid material 301. When the light guide member liquid material 301 is applied on the light emitting element 10, after applying the light guide member liquid material 301 on the main light emitting surface (i.e., the surface that will later become the top surface) of the light emitting element 10, the region of the light-transmissive member 20 containing a high concentration of the fluorescent substance 25, which will become the first region 20a, is connected to the light guide member liquid material 301. At this time, the light guide member liquid material 301 is made to reach the second region 20b, and is made to creep up the lateral surfaces of the light emitting element 10. For the coating method of the light guide member liquid material 301, it is possible to use a dispensing method, a transfer method, a dipping method, etc. Also, of the two principal surfaces of the light-transmissive member 20 (in the first embodiment, the sheet member 209), i.e., the top surface and the bottom surface of the sheet member 209 in FIG. 2B, the light emitting element 10 is preferably connected to, though either is acceptable, the surface at a side with a higher concentration of the fluorescent substance 25. With this arrangement, heat emitted by the fluorescent substance 25 can be easily drawn via the light emitting element 10. Further, the fluorescent substance 25 can be disposed farther from the external environment to be easily protected, so that the light emitting device can have high reliability even in the case of, for example, using the fluorescent substance 25 which is vulnerable to moisture, etc.

Figure 2C:
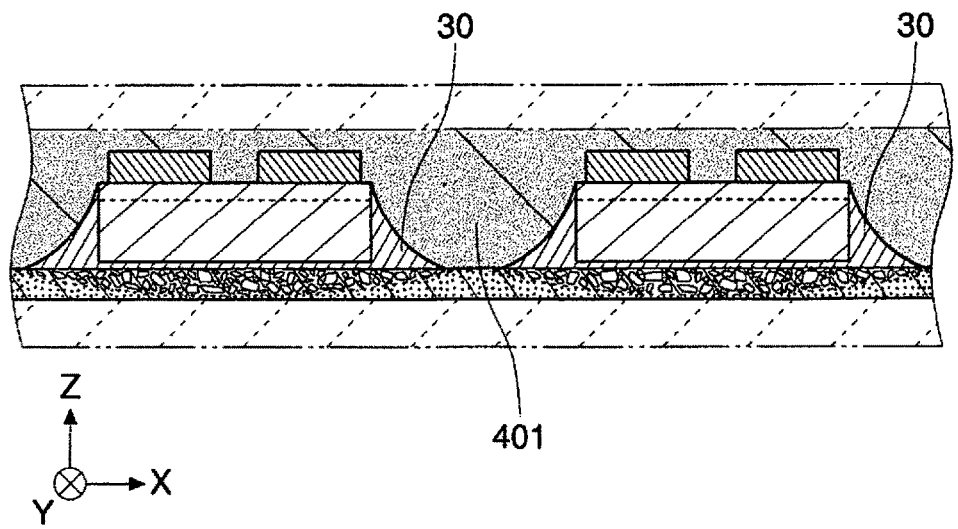
FIG. 2C is a schematic cross sectional view showing one stage of the method of manufacturing a light emitting device according to the first embodiment of the present invention.

As shown in FIG. 2C, in the third stage, the outer surfaces of the light guide members 30 is covered by the light reflective member 40. More specifically, the light reflective member liquid material 401 is applied on the outer surface of the light guide member 30 and is hardened or solidified. In the first embodiment, the light reflective member liquid material 401 continuously covers the outer surfaces of the light guide members 30 each surrounding a respective one of a plurality of the light emitting elements 10, so that a collective light reflective member 409 is formed. At this time, it is preferable that the light reflective member liquid material 401 reaches a surface of the light emitting element 10 opposite to the main light emitting surface of the light emitting element 10 (i.e., a portion of a surface that will later become the bottom surface of the light emitting device other than the positive and negative electrodes). With the light reflective member 40 continuously covering from the outer surface of the light guide member 30 to the surface opposite to the main light emitting surface of the light emitting element 10 (i.e., a portion of the surface that will later become the bottom surface of the light emitting device other than the positive and negative electrodes), it is possible to increase the extraction efficiency of light in the principal light emitting direction. The light reflective member 40 can be formed using compression molding, transfer molding, injection molding, potting, etc. To expose the electrodes 50 from the light reflective member 40, for example, the amount of the light reflective member 40 is adjusted to be small, grinding is performed after forming a large amount of the light reflective member 40, or the light reflective member 40 is formed in a state where the surface of the electrodes 50 is masked.

Figure 2D:
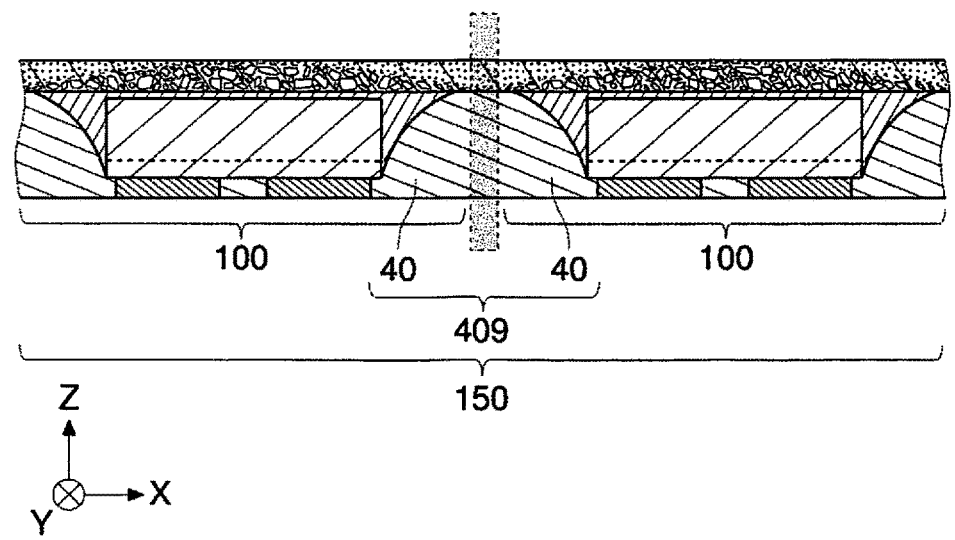
FIG. 2D is a schematic cross sectional view showing one stage of the method of manufacturing a light emitting device according to the first embodiment of the present invention.

As shown in FIG. 2D, in the fourth stage, the light emitting device collective body 150 is divided. More specifically, at a predetermined position in the light emitting device collective body 150, more specifically, in the region between the light emitting elements 10 where the sheet member 209 and the light reflective member collective body 409 is layered, cutting is performed linearly or in a grid-shaped manner, so that the light emitting devices 100 is singulated. To cut the light emitting device collective body 150, for example, it is possible to use a dicer, an ultrasonic cutter, a Thomson blade, etc. In the case of manufacturing the light emitting devices 100 individually one at a time, it is possible to omit this fourth stage.

Second Embodiment

Figure 3A:
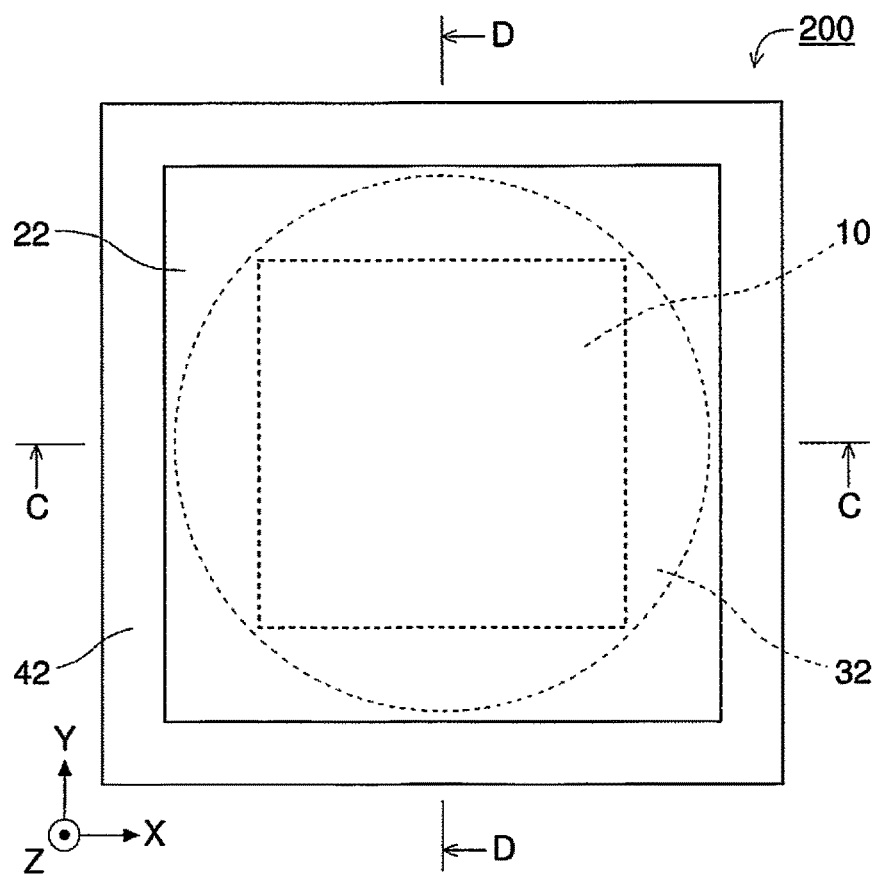
FIG. 3A is a schematic top view of the light emitting device according to a second embodiment of the present invention.
Figure 3B:
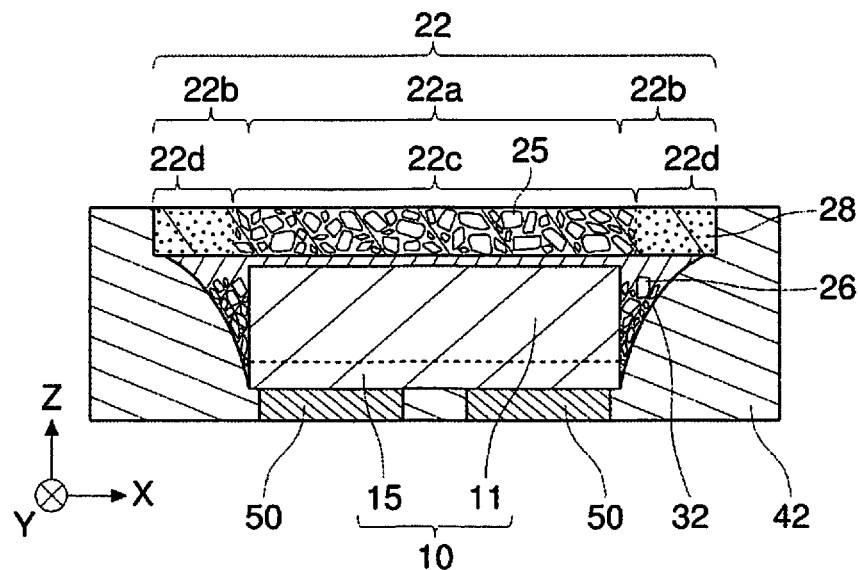
FIG. 3B is a schematic cross sectional view of the light emitting device taken along a line C-C in FIG. 3A.
Figure 3C:
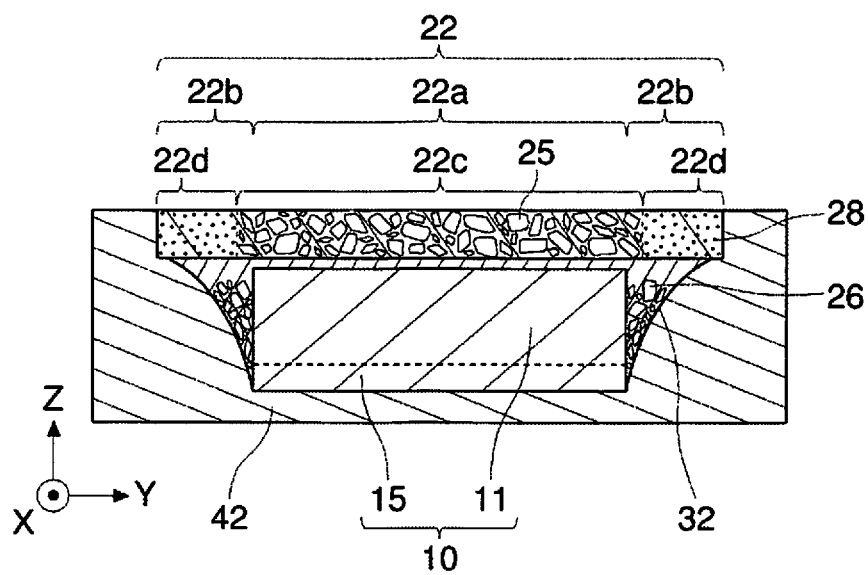
FIG. 3C is a schematic cross sectional view of the light emitting device taken along a line D-D in FIG. 3A.

FIG. 3A is a schematic top view of a light emitting device 200 of the second embodiment of the present invention. FIG. 3B is a schematic cross sectional view taken along a line C-C of the light emitting device 200 shown in FIG. 3A. FIG. 3C is a schematic cross sectional view taken along a line D-D of the light emitting device 200 shown in FIG. 3A. Configurations of the light emitting device 200 that differ from the light emitting device 100 of the first embodiment will be described below, and description of configurations substantially the same as that in the light emitting device 100 of the first embodiment will be omitted as appropriate.

As shown in FIGS. 3B and 3C, in the light emitting device 200 of the second embodiment, a second region 22b includes a fluorescent substance-containing portion 22c and a fluorescent substance-free portion 22d at a lateral side of the fluorescent substance-containing portion 22c. More specifically, the region in the second region 22b in which the fluorescent substance 25 is distributed is predominant at the light emitting element 10 side. Accordingly, heat generating region due to the fluorescent substance 25 and the non-heat generating region can be clearly divided from each other in a latera direction in the second region 22b, so that and facilitation of the drawing of heat from the heat generating region to the non-heat generating region can be expected. The boundary between the fluorescent substance-containing portion 22c and the fluorescent substance-free portion 22d is most preferably parallel to the thickness direction of the light-transmissive member 22, i.e., the Z direction, but in accordance with the processing precision, etc., during manufacturing, an inclination of 10° or less toward the inside or the outside may be accepted. The fluorescent substance-containing portion 22c is continuous in the first region 22a. In particular, in the example shown in FIGS. 3B and 3C, the fluorescent substance-containing portion 22c is disposed across an entirety of the first region 22a. Further, in the example shown in FIGS. 3B and 3C, the concentration of the fluorescent substance 25 in the fluorescent substance-containing portion 22c is uniform across the entire region, but may be different depending on the location. For example, the concentration of the fluorescent substance 25 in the fluorescent substance-containing portion 22c in the first region 22a may be higher than the concentration of the fluorescent substance 25 in the fluorescent substance-containing portion 22c in the second region 22b.

The second region 22b may not contain the fluorescent substance 25. This allows for reducing heat generation in the second region 22b greatly easily, so that degradation of the second region 22b due to heat can be even further reduced.

As shown in FIGS. 3B and 3C, in the light emitting device 200 of the second embodiment, the light guide member 32 contains the second fluorescent substance 26. Accordingly, lack of the fluorescent substance 25 in the second region 22b is compensated, so that unevenness of the light emission color distribution can be reduced. This is particularly suitable in the case where the second region 22b includes the fluorescent substance-free portion 22d. Then, in the examples shown in FIGS. 3B and 3C, the concentration of the second fluorescent substance 26 in the light guide member 32 is higher at the lower side than the upper side. With this arrangement, heat generation is can be reduced at the upper part of the light guide member 32, more specifically, the second region 22b side, which allows for facilitating drawing the heat generated by the fluorescent substance 25, particularly the heat in the second region 22b, to the light guide member 32. Also, in the case where the top surface of the light emitting element 10 is a surface of the substrate 11 as described above, heat generated by the second fluorescent substance 26 can be easily drawn toward the bottom surface side and the semiconductor layered body 15 side.

As shown in FIGS. 3A to 3C, in the light emitting device 200 of the second embodiment, the lateral surfaces of the light-transmissive member 22 is covered by the light reflective member 42. With this arrangement, leaking of light from the light-transmissive member 22 in a lateral direction can be reduced, and thus unevenness in the light emission color distribution can be reduced. Further, drawing of heat from the second region 22b to the light reflective member 42 can be expected. In view of this, it is preferable that the light reflective member 42 cover a half or more of the surface area of each lateral surface of the light-transmissive member 22 in the thickness direction of the light-transmissive member 22, more preferable that it cover three-fifth or more of the surface area of each lateral surface of the light-transmissive member 22, and even more preferable that it cover an entirety of each lateral surface of the light-transmissive member 22. Alternatively, as in the light emitting device 100 of the first embodiment, the entire area of each lateral surface of the light-transmissive member 20 is exposed from the light reflective member 40, in other words, forms a portion of respective one of the lateral surfaces of the light emitting device 100. This allows for easily increasing light extraction efficiency.

Method of Manufacturing Light Emitting Device 200

FIGS. 4A, 4B, 4C, and 4D are schematic cross sectional views illustrating a first stage, second stage, third stage, and fourth stage, respectively of the method for manufacturing the light emitting device 200 of the second embodiment. Hereafter, configurations that differ from the method of manufacturing the light emitting device 100 of the first embodiment will be described, and description of configurations that are substantially the same as the method for manufacturing the light emitting device 100 of the first embodiment will be omitted as appropriate.

Figure 4A:
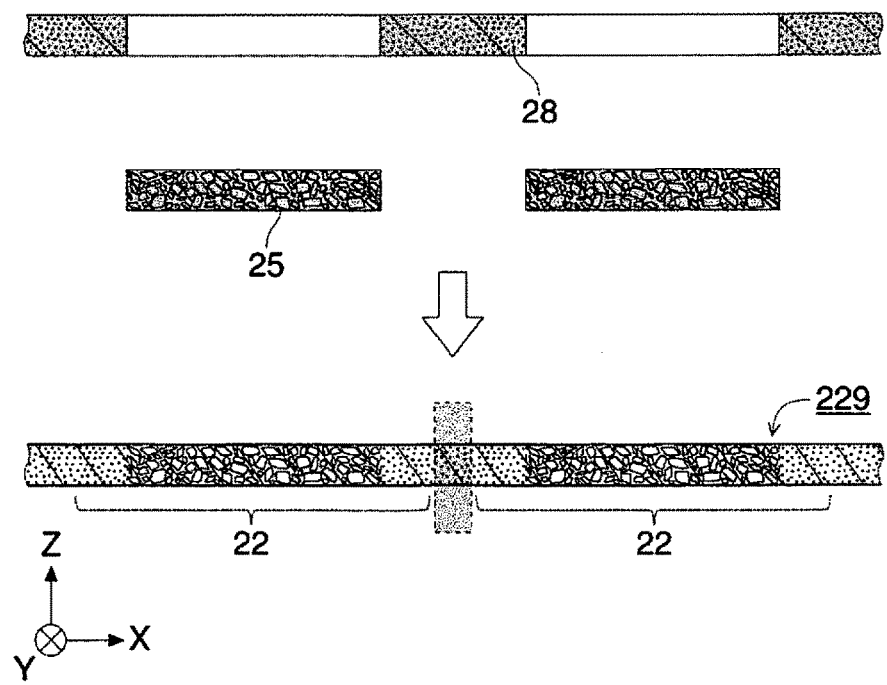
FIG. 4A is a schematic cross sectional view showing one stage of the method of manufacturing a light emitting device according to the second embodiment of the present invention.

As shown in FIG. 4A, the first stage is the stage when the light-transmissive member 22 is provided. More specifically, the light-transmissive members 22 are obtained by, for example, forming a sheet member 229 that contains the fluorescent substance 25 and the light scattering material 28, and dividing this sheet member 229. In other words, the sheet member 229 is a collective body of the light-transmissive members 22. Also, in the first stage of the second embodiment, the light-transmissive member 22 is provided by dividing the sheet member 229 into blocks before connecting with the light emitting elements 10. To form the sheet member 229, it is preferable to form, in advance, the plurality of blocks containing the fluorescent substance 25, or a sheet that contains the light scattering material 28 with a plurality of openings (e.g., a grid-shaped sheet). This allows for easily controlling the distribution of the fluorescent substance 25 and the light scattering material 28 in the sheet member 229 to be a suitable distribution, and thus allows for facilitating providing the light-transmissive member 22 with good productivity. In the case where the block containing the fluorescent substance 25 is formed, the sheet member 229 can be formed by arranging a plurality of blocks containing the fluorescent substance 25 to be separated from each other on an adhesive sheet, etc., filling a liquid material containing the light scattering material 28 in the separated region, and then performing hardening or solidifying. In the case where the sheet containing the light scattering material 28 with openings is formed, the sheet member 229 can be formed by placing the sheet with openings containing the light scattering material 28 on an adhesive sheet, etc., filling the liquid material containing the fluorescent substance 25 inside each of the openings, and then performing hardening or solidifying. For cutting the sheet member 229, it is possible to use, for example, a dicer, an ultrasonic cutter, or a Thomson blade.

Figure 4B:
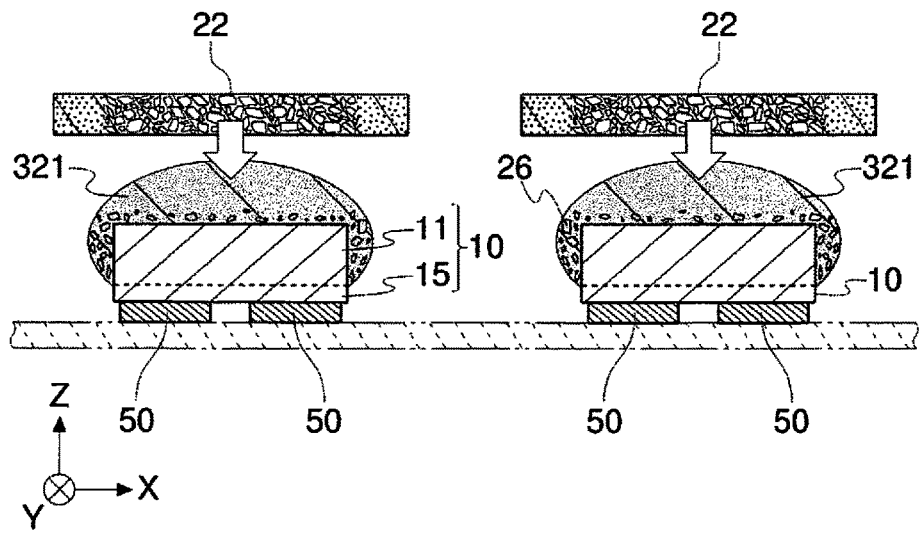
FIG. 4B is a schematic cross sectional view showing one stage of the method of manufacturing a light emitting device according to the second embodiment of the present invention.

As shown in FIG. 4B, in the second stage, the light-transmissive member 22 is placed above the light emitting element 10 via the light guide member 32. More specifically, a light guide member liquid material 321 is applied on one or both of the light emitting element 10 and the light-transmissive member 22. Then, after the light emitting element 10 and the light-transmissive member 22 are connected via the light guide member liquid material 321, the light guide member liquid material 321 is hardened or solidified. When the light guide member liquid material 321 is applied on the light-transmissive member 22, after applying the light guide member liquid material 321 on the region of the light-transmissive member 22 containing a high concentration of the fluorescent substance 25, which will become the first region 22a, the top surface of the light emitting element 10 is connected to the light guide member liquid material 321. When the light guide member liquid material 321 is applied on the light emitting element 10, after applying the light guide member liquid material 321 on the top surface of the light emitting element 10, the region of the light-transmissive guide 22 containing a high concentration of the fluorescent substance 25, which will become the first region 22a, is connected to the light guide member liquid material 321. At this time, the light guide member liquid material 321 is made to reach the second region 22b, and is made to creep up the lateral surfaces of the light emitting element 10. Also, by the time the light guide member liquid material 321 is completely hardened or solidified, the second fluorescent substance 26 is precipitated by gravity or centrifugal force, which allows for unevenly distributing the second fluorescent substance 26 to be predominantly disposed in a desired direction.

Figure 4C:
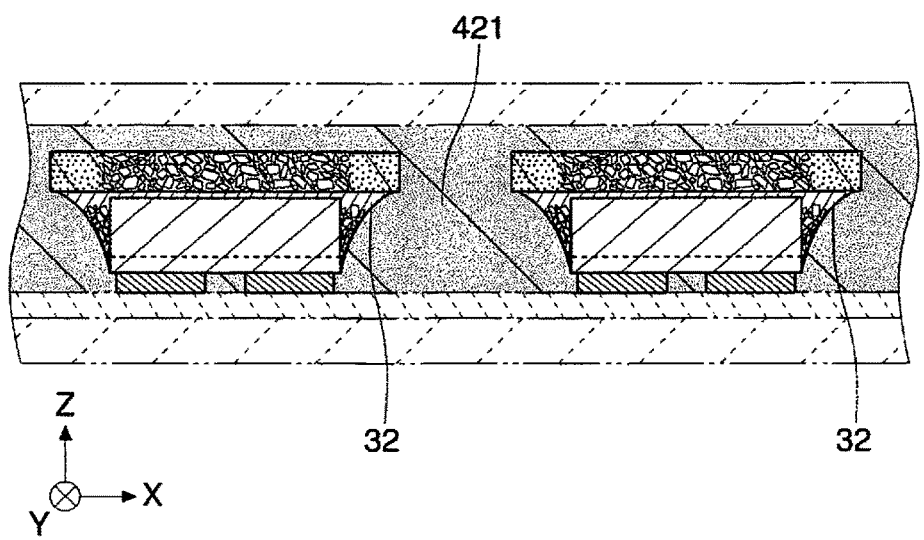
FIG. 4C is a schematic cross sectional view showing one stage of the method of manufacturing a light emitting device according to the second embodiment of the present invention.

As shown in FIG. 4C, in the third stage, the outer surfaces of the light guide members 32 is covered by the light reflective member 42. More specifically, the light reflective member liquid material 421 is applied on the outer surfaces of the light guide members 32 and then hardened or solidified. In the second embodiment, the light reflective member liquid material 421 continuously covers the outer surfaces of the light guide members 32 of the plurality of light emitting elements 10, and thus is formed as a collective light reflective member 429. At this time, the light reflective member liquid material 421 reaches the lateral surfaces of each light-transmissive member 22. To expose the main light emission surface of the light-transmissive member 22 from the light reflective member 42, for example, the amount of the light reflective member 42 is adjusted to be small, grinding is performed after forming a large amount of the light reflective member 42, or the light reflective member 42 is formed in a state with the primary light emission surface of the light-transmissive member 22 masked.

Figure 4D:
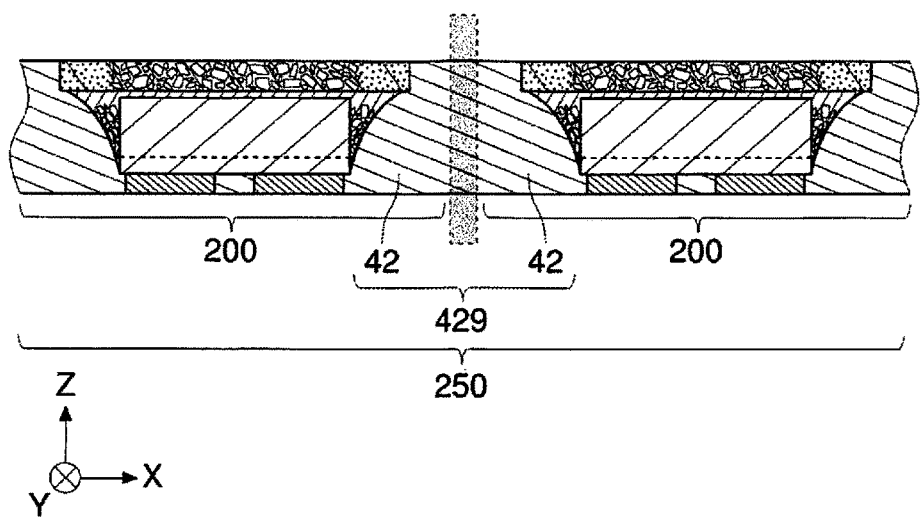
FIG. 4D is a schematic cross sectional view showing one stage of the method of manufacturing a light emitting device according to the second embodiment of the present invention.

As shown in FIG. 4D, in the fourth stage, the light emitting device collective body 250 is divided. More specifically, at a predetermined position in the light emitting device collective body 250, more specifically, in the region between light-transmissive members 22 where the collective light reflective member 429 is disposed, cutting is performed linearly or a grid-shaped manner, so that the light emitting device 200 can be singulated.

Hereafter, components of the light emitting device according to certain embodiments of the present invention will be described.

Light Emitting Element 10

For the light emitting element, a semiconductor light emitting element is preferably used, but an organic EL element is may be used. An example of a semiconductor light emitting element includes an LED (light emitting diode) chip. The semiconductor light emitting element includes a semiconductor layered body that configures the light emitting element structure, and may also further include a substrate. In a top view, the light emitting element preferably has a rectangular shape, and in particular a square shape or a rectangular shape elongated in one direction. Lateral surfaces of the light emitting element or of the substrate therein may be perpendicular to the top surface thereof, or may be inclined inward or outward. The light emitting element preferably includes positive and negative (p, n) electrodes on the same surface side. In the case where the light emitting element is a flip-chip (face down) mounting type, the main light emission surface is opposite to the electrode formation surface. A single light emitting element or a plurality of light emitting elements may be mounted in a single light emitting device. The plurality of light emitting elements can be connected in series or in parallel. In the case where the plurality of light emitting elements are connected to a single light-transmissive member, each of regions in the light-transmissive member directly above the top surface of respective one of the light emitting elements can be regarded as a first region, and the region at a lateral side of the first region, in other words, the region other than the first region, can be regarded as the second region.

Substrate 11

For the substrate, a substrate for crystal growth, on which a semiconductor crystal can be grown, is easily used, and thus is preferable, but a substrate for bonding, to which a semiconductor layered body separated from the substrate for crystal growth is bonded, may be used. With the light-transmissive substrate, flip-chip mounting can be easily used, and light extraction efficiency can be easily increased. For the substrate, one of sapphire, gallium nitride, aluminum nitride, silicon, silicon carbide, gallium arsenide, gallium phosphide, indium phosphide, zinc sulfide, zinc selenide, and glass can be used. Among these, sapphire has good light-transmissivity, and is relatively low cost and easy to obtain as a substrate for crystal growth of a nitride semiconductor, and thus is preferable. Also, gallium nitride is suitable for a substrate for crystal growth of a nitride semiconductor, and is preferable in view of having relatively high thermal conductivity. A thickness of the substrate thickness can be selected as appropriate, but in view of light extraction efficiency, mechanical strength, etc., the substrate preferably has a thickness of 50 μm-500 μm, and more preferably 80 μm-300 μm.

Semiconductor Layered Body 15

The semiconductor layered body includes an n-type semiconductor layer and a p-type semiconductor layer, and preferably includes an active layer between them. For the semiconductor material, it is preferable to use a nitride semiconductor that can efficiently emit light of a short wavelength, which easily excites the fluorescent substance. For the nitride semiconductor, the nitride semiconductor is mainly represented by the general formula $In_xAl_yGa_{1-x-y}N$ ($0 \leq x$, $0 \leq y$, $x+y \leq 1$). Other examples of the nitride semiconductor include zinc sulfide, zinc selenide, and silicon carbide. The peak emission wavelength of the light emitting element is preferably in the blue light range in view of light emitting efficiency, fluorescent substance excitation, and the relationship of mixing color with the emitted light, etc., and is preferably in a range of 450 nm-475 nm. A thickness of the semiconductor layered body can be selected as appropriate, but in view of light emitting efficiency, crystallinity, etc., the semiconductor layered body preferably has a thickness of 1 μm to 10 μm, and more preferably 3 μm to 10 μm.

Light-Transmissive Members 20, 22

The light-transmissive member has a function of transmitting light of the light emitting element to outside the device while protecting the light emitting element, the light guide member, and the light reflective member from outside air and external forces, etc. The light-transmissive member at least contains light-transmissive main material, and further contains a fluorescent substance in those main materials. In the top view, the light-transmissive member has a larger size than that of the light emitting element, and preferably has a similar shape as the top view shape of the light emitting element in terms of light intensity distribution and chromaticity distribution, etc. If the top surface and/or the bottom surface of the light-transmissive member is a flat surface, productivity can be increased, and if the top surface and/or the bottom surface of the light-transmissive member is a surface with irregularities or is a curved surface, the light extraction efficiency can be increased. The light-transmissive member can be a single layer in the thickness direction, or can be a layered body including a plurality of layers. In the case where the light-transmissive member is a layered body, it is possible to use various different types of main materials for each layer, and possible to contain different types of fluorescent substance in each layer. Also, with the light-transmissive member having the outermost layer that does not contain a fluorescent substance, degradation of the fluorescent substance due to outside air, etc., can be reduced. A thickness of the light-transmissive member can be selected as appropriate, but in view of light extraction efficiency, the fluorescent substance content, etc., the light-transmissive member preferably has a thickness of 50 μm to 500 μm, and more preferably 80 μm to 300 μm.

Main Material of the Light-Transmissive Member

For the main material of the light-transmissive member, it is possible to use at least one of silicone resin, epoxy resin, phenol resin, polycarbonate resin, acrylic resin, modified resins of these, and glass. Among these, silicone resin or its modified resin is preferable in view of good heat resistance and light resistance. Specific examples of the silicone resin include dimethyl silicone resin, phenyl methyl silicone resin, and diphenyl silicone resin. In particular, a silicone resin including a phenyl group allows for enhancing the heat resistance and gas barrier properties. Of the total organic group bonded with silicon atoms in the silicone resin or a modified resin thereof, the content of the phenyl base is preferably 10 mol % to 70 mol %, and more preferably 20 mol % to 60 mol %. The "modified resins" in this specification include hybrid resins.

Fluorescent Substance 25, 26

The fluorescent substance absorbs at least a portion of light emitted from the light emitting element (i.e., primary light), and emits light of a different wavelength from that of the primary light (i.e., secondary light). This allows for obtaining a light emitting device configured to emit light of a wavelength of visible light primary light and secondary light mixed color light such as white light, for example. In the case of a white-light emitting device, the emitted light color range preferably conforms to the ANSI C78.377 standard. The content of the fluorescent substance in the light-transmissive member can be selected as appropriate according to the desired chromaticity of emitted light, but, for example, is preferably 40 parts by weight to 250 parts by weight, and more preferably 70 parts by weight to 150 parts by weight. "Parts by weight" represents weight (g) of the particles mixed in the weight 100 g of the main materials. The peak emission wavelength of the green light emitting fluorescent substance is preferably in the range of 520 nm to 560 nm in view of mixed color relationship with light of other light sources, etc. More specifically, examples of the green light emitting fluorescent substance include yttrium-aluminum-garnet based phosphor (e.g., $Y_3(Al, Ga)_5O_{12}:Ce$), lutetium-aluminum-garnet based phosphor (e.g., $Lu_3(Al, Ga)_5O_{12}:Ce$), terbium-aluminum-garnet based phosphor (e.g., $Tb_3(Al, Ga)_5O_{12}:Ce$), silicate based phosphor (e.g., $(Ba, Sr)_2SiO_4:Eu$), chlorosilicate based phosphor (e.g., $Ca_8Mg(SiO_4)_4C_{12}:Eu$), β sialon based phosphor (e.g., $Si_{6-z}Al_zO_zN_{8-z}:Eu$ ($0<z<4.2$)), SGS based phosphor (e.g., $SrGa_2S_4:Eu$). Examples of the yellow light emitting fluorescent substance include α sialon based phosphor (e.g., $Mz(Si, Al)_{12}(O,N)_{16}$ (where $0<z\leq2$, and M is a lanthanide element except for Li, Mg, Ca, Y, and La and Ce)). In addition, there are also yellow light emitting fluorescent substances among the aforementioned green light emitting fluorescent substances. Also, for example, with the yttrium-aluminum-garnet based phosphors, substituting a portion of Y with Gd allows for shifting the peak emission wavelength to the longer wavelength side, and possible to emit yellow light. Also, these fluorescent substance include fluorescent substance that can emit orange light. The peak emission wavelength of the fluorescent substances adapted to emit red light is preferably in the range of 620 nm to 670 nm in view of the mixed color relationship with light of other light sources, etc. More specifically, examples of the red light emitting fluorescent substance include nitrogen-containing calcium aluminosilicate (CASN or SCASN) based phosphor (e.g., $(Sr, Ca)AlSiN_3:Eu$), etc. Examples of the red light emitting fluorescent substance further include manganese-activated fluoride-based phosphors (phosphors represented by the general formula (I) $A_2[M_{1-a}Mn_aF_6]$ (where in the general formula (I), A is at least one element selected from a group consisting of K, Li, Na, Rb, Cs, and $NH_4$, M is one element selected from a group consisting of group 4 elements and group 14 elements, and a satisfies $0<a<0.2$)). A representative example of this manganese activated fluoride based phosphor is a manganese activated potassium fluorosilicate phosphor (e.g. $K_2SiF_6:Mn$). For the fluorescent substance, one of the specific examples described above can be singly used, or two or more thereof can be used in combination. For example, the fluorescent substance may be made of phosphors adapted to emit green to yellow light, and phosphors adapted to emit red light. With such a configuration, light emission with good color reproduction or color rendering properties can be obtained. On the other hand, however, this allows a large amount of the fluorescent substance to be used, and accordingly heat generation is increased, so that the configuration of the light emitting device of this embodiment can easily exhibit effects. It is also particularly preferable that the red light emitting phosphor be a manganese-activated fluoride-based phosphor. The manganese activated fluoride based phosphors can emit light with narrow half width in the spectrum of the red light range, but has relatively low light emitting efficiency, so that used amount thereof tends to be increased, and thus the heat generation easily increases. Therefore, the configuration of the light emitting device of this embodiment can further easily exhibit effects.

Light Scattering Material 28

For the light scattering material, an organic substance may be used, but an inorganic substance with good heat resistance and light resistance is preferably used. Also, using an inorganic substance allows the light scattering material to also function as a filler for adjusting the thermal conductivity, the coefficient of thermal expansion, etc., of the light-transmissive member. For the inorganic substance, it is preferable to use at least one of silicon oxide, titanium oxide, magnesium oxide, zinc oxide, aluminum oxide, zirconium oxide, calcium carbonate, and barium sulfate. Among these, magnesium oxide, zinc oxide, and aluminum oxide are preferable in terms of thermal conductivity. Also, silicon oxide, titanium oxide, and zirconium oxide is relatively inexpensive and easy to obtain, and thus is preferable. Using an organic substance has an advantage of being able to adjust optical characteristics using copolymerization, etc. More specifically, for the organic substance, polymethacrylic acid esters and copolymers thereof, polyacrylic acid esters and copolymers thereof, cross-linked polymethacrylic acid esters, cross-liked polyacrylic acid esters, polystyrene and copolymers thereof, cross-linked polystyrene, silicone resin, or modified resins of these is preferably used. For the light scattering material, it is possible to use one of these singly, or to use a combination of two or more of these. The content of the light scattering material in the light-transmissive member can be selected as appropriate, but it is preferably 1 part by weight to 100 parts by weight, and more preferably 5 parts by weight to 50 parts by weight. The shape of the light scattering material can be selected as appropriate, and can be a granular type (amorphous), but a sphere is preferable in terms of filling ability, reduction in aggregation, etc.

Light Guide Members 30, 32

The light guide member is light-transmissive, and in addition to guiding light of the light emitting element to the light-transmissive member, is also able to adhere the light emitting element and the light-transmissive member. The outer surface of the light guide member, that is, the interface between the light guide member and the light reflective member, is preferably tilted or curved with respect to the lateral surfaces of the light emitting element and the bottom surface of the light-transmissive member, in view of light extraction efficiency. For the main materials of the light guide member, it is possible to use at least one of silicone resin, epoxy resin, phenol resin, polycarbonate resin, acrylic resin, modified resins of these, and glass. Among these, silicone resin or a modified resin thereof has good heat resistance and light resistance, and thus is preferable. Specific examples of the silicone resin include dimethyl silicone resin, phenyl methyl silicone resin, and diphenyl silicone resin. In particular, with a phenyl group, the heat resistance and gas barrier properties are enhanced. The content of the phenyl group in the total organic groups bonded to silicon atoms in the silicone resin or modified resin thereof is preferably 10 mol % to 70 mol %, and more preferably 20 mol % to 60 mol %. The light guide member can also contain various fillers in the main material to adjust the thermal conductivity, coefficient of thermal expansion, etc. For such a filler, it is possible to use the same material as the light scattering material of the aforementioned inorganic substance.

Light Reflective Members 40, 42

The light reflective member is preferably white in view of light extraction efficiency. Thus, the light reflective member preferably contains white pigment in the main material. For the main material of the light reflective member, it is possible to use at least one of silicone resin, epoxy resin, phenol resin, polycarbonate resin, acrylic resin, modified resins of these, and glass. Among these, silicone resin or a modified resin thereof has good heat resistance and light resistance, and thus is preferable. Specific examples of the silicone resin include dimethyl silicone resin, phenyl methyl silicone resin, and diphenyl silicone resin. In particular, with a phenyl group, the heat resistance and gas barrier properties are enhanced. The content of the phenyl group in the total organic groups bonded to silicon atoms in the silicone resin or modified resin thereof is preferably 10 mol % to 70 mol %, and more preferably 20 mol % to 60 mol %. For the white pigment, it is possible to use singly one of or a combination of two or more of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. Among these, titanium oxide has good light reflectivity and is relatively inexpensively obtained. The content of white pigment within the light reflective member can be selected as appropriate, but in view of light reflectivity and viscosity in a state of a liquid material, it is preferably 20 parts by weight to 300 parts by weight, and more preferably 50 parts by weight to 200 parts by weight.

Electrode 50

The electrodes 50 can be the positive and negative electrodes of the light emitting element, or can be different electrodes connected to the positive and negative electrodes of the light emitting element. Examples of such different electrodes include bumps, pillars, or lead electrodes (singulated lead frames), etc. The electrodes can be small pieces of metal or an alloy. More specifically, it is possible to use at least one of gold, silver, copper, iron, tin, platinum, zinc, rhodium, titanium, nickel, palladium, aluminum, tungsten, chrome, molybdenum, and alloys of two or more of these. Among these, copper has good thermal conductivity and is relatively inexpensive, so copper or a copper alloy is preferable. Also, gold is also chemically stable and surface oxidation thereof is small, which facilitates bonding, and thus gold or a gold alloy is also preferable. In view of solder bondability, the electrodes can also have a gold or silver film on the surface.

The top view type light emitting devices was described above as an example of the light emitting devices of the first and second embodiments, but the light emitting device may be a side view type light emitting device according to the positional relationship of the electrodes terminals with respect to the principal light emission direction. The mounting direction of the top-view type light emitting device is substantially parallel to the principal light emission direction, and is the reverse direction with respect to the principal light emission direction. For example, the light emitting device of the first and second embodiments is mounted in a downward direction. On the other hand, the side surface emission type light emitting device is mounted substantially perpendicularly to the principal light emission direction. Also, for the light emitting devices of the first and second embodiments, a light emitting device without a mounting substrate on which the light emitting element is to be mounted is used as an example, but a light emitting device in which the light emitting element is mounted on a mounting substrate may be alternatively used. In that case, at the second stage (FIG. 2B, FIG. 4B), the light emitting element bonded by solder, etc., on the wiring of the mounting substrate is used, and at the third stage (FIG. 2C, FIG. 4C), the light reflective member is formed on the mounting substrate. After that, if the mounting substrate is in a state of a collective substrate, at the fourth stage (FIG. 2D, FIG. 4D), the mounting substrate can be cut together with the sheet member and the light reflective member, etc.

EXAMPLE

An example according to one embodiment of the present invention will be described below in detail. It is noted that the present invention is not limited only to the example shown below.

Example 1

The light emitting device of Example 1 is a top surface-emitting CSP type LED device having a rectangular-parallelepiped shape with a width of 1.7 mm, a depth of 1.7 mm, and a thickness of 0.28 mm, and having the structure of the light emitting device 100 of the example shown in FIG. 1A to 1C. The light emitting element 10 is an LED chip of width 1 mm, depth 1 mm, thickness 0.155 mm with a square shape in a top view that can emit blue light at light emission peak wavelength of 455 nm. The light emitting element 10 has a sapphire substrate 11, and a semiconductor layered body 15 in which an n type semiconductor layer of a nitride semiconductor, an active layer, and a p type semiconductor layer are layered in order on the sapphire substrate 11 so as to be in contact with the bottom surface of that substrate 11. The light-transmissive member 20 is disposed above the light emitting element 10 and connected to the light emitting element 10 via the light guide member 30. The light-transmissive member 20 is a small piece of a phosphor-containing resin sheet that has a square shape in a top view and has a width of 1.7 mm, a depth of 1.7 mm, and thickness of 0.1 mm. In the top view, the center and orientation of the light emitting element 10 corresponds to the light-transmissive member 20 (note that manufacturing errors are allowed). The light-transmissive member 20 is configured by two layers described below, an upper layer and lower layer. However, a boundary between the upper layer and lower layer is not observed. The lower layer is, as the fluorescent substance 25, a hardened substance of phenyl methyl silicone resin that contains β sialon based phosphor and manganese-activated fluoride based phosphor. The upper layer is, as the light scattering material 28, a hardened substance of a phenyl methyl silicone resin containing spherical particles of aluminum oxide of average particle diameter of 20 to 25 nm. A thickness of the lower layer is gradually increased toward the center of the first region 20a from the lateral end of the second region 20b. Then, the fluorescent substance 25 is distributed at substantially uniform concentration in the entire area of the lower layer (specifically, at volumetric concentration of 25%). Thus, the concentration of the fluorescent substance 25 in the light-transmissive member 20 is lowest at the lateral end part of the second region 20b, and is highest at the center part of the first region 20a. On the other hand, a thickness of the upper layer is gradually increased toward the lateral end of the second region 20b from the center of the first region 20a. Then, the light scattering material 28 is distributed at substantially uniform concentration in the entire region of the upper layer (specifically, at volumetric concentration of 4.5%). Thus, the concentration of the light scattering material 28 in the light-transmissive member 20 is lowest at the center part of the first region 20a, and highest at the lateral end part of the second region 20b. The light guide member 30 covers the top surface of the light emitting element 10 and the bottom surface of the first region 20a of the light-transmissive member, the four lateral surfaces of the light emitting element 10, and the bottom surface of the second region 20b of the light-transmissive member. The outer surface of the light guide member 30 is inclined or curved with respect to the lateral surfaces of the light emitting element 10 and the bottom surface of the second region 20b of the light-transmissive member. The light guide member 30 is a hardened substance of phenyl methyl silicone resin that does not contain a fluorescent substance. The light reflective member 40 covers the outer surface of the light guide member 30 at a lateral side of the light emitting element 10, and covers the region except for the positive and negative electrodes of the bottom surface of the light emitting element 10 below the light emitting element 10. In the case where a portion (i.e., a bottom part) of each of the lateral surfaces of the light emitting element 10 is not covered by the light guide member 30, the light reflective member 40 covers the portion (i.e., bottom part) of the side surface of the light emitting element 10. The light reflective member 40 is a hardened substance of the phenyl methyl silicone resin that contains 150 parts by weight of titanium oxide. Each of the electrodes 50 is connected to a respective one of the positive and negative electrodes formed on the bottom surface of the semiconductor layered body 15 of the light emitting element. The electrodes 50 are small pieces of copper on which a nickel/gold layered film is disposed with a thickness of 0.025 mm. The bottom surface of each of the electrodes 50, that is, a surface of the gold layer of the layered film, is exposed from the light reflective member 40. In more detail, the bottom surface of this light emitting device 100 includes the bottom surface of the light reflective member 40 and the bottom surface of each of the electrodes 50.

The light emitting device according to the Example 1, as described hereafter, is manufactured by forming the light emitting device collective body 150, and then dividing that light emitting device collective body 150 using a dicing apparatus. The sheet member 209 is fabricated by pressure bonding and completely hardening a semi-hardened first element sheet and a semi-hardened second element sheet. The fluorescent substance 25 is distributed in the first element sheet and a thickness of the first element sheet varies so as to form a lateral and longitudinal periodic pattern of distribution of an amount of the fluorescent substance 25 and a thickness approximate to that of the aforementioned lower layer of the light-transmissive member 20. Likewise, the light scattering material 28 is distributed in the second element sheet and a thickness of the second element sheet varies so as to form a lateral and longitudinal periodic pattern of distribution of an amount of the light scattering material 28 and a thickness approximate to that of the aforementioned upper layer of the light-transmissive member 20. Next, on each of regions of that sheet member 209 containing high concentrations of the fluorescent substance 25, the light guide member liquid material 301 is applied using a pin transfer method. Next, the substrate 11 side of the light emitting element 10, in which a small piece of copper is connected to each of the positive and negative electrodes, is mounted on each light guide member liquid material 301 applied on the sheet member 209. At this time, the pushing amount of the light emitting element 10 is adjusted to allow the light guide member liquid material 301 to be spread on the sheet member 209 and to creep up on the four lateral surfaces of the light emitting element 10. Then, the light guide member liquid material 301 is hardened in an oven. Next, the light reflective member liquid material 401 is filled using a compression molding method so as to bury all of the light emitting element 10, and is hardened. Then, the obtained light reflective member collective body 409 is ground to expose the small pieces of copper. After that, a nickel/gold layered film is formed on an exposed surface of each copper small piece using a sputtering device, so that the electrodes 50 are formed. Then, the light emitting device collective body 150 obtained in such manner as described above is cut into grid form.

The light emitting device of Example 1 configured as described above is able to exhibit similar effects as those of the light emitting device 100 of the first embodiment.

The light emitting device of the first embodiment of the present invention can be used for a backlight device for a liquid crystal display apparatus, various types of illumination equipment, large sized display apparatuses, various types of display apparatuses for advertising or a destination guide, etc., projector devices, and also for image reading devices of digital video cameras, fax machines, copy machines, scanners, etc.

What is claimed is:
1. A light emitting device comprising:
a light emitting element;
a light-transmissive member above the light emitting element, the light-transmissive member including a first region directly above a top surface of the light emitting element and a second region at a lateral side of the first region;
a light guide member covering a lateral surface of the light emitting element and a bottom surface of the second region of the light-transmissive member; and
a light reflective member covering an outer surface of the light guide member, wherein the light-transmissive member contains a fluorescent substance and a light scattering material that is not a fluorescent substance, a concentration of the fluorescent substance in the light-transmissive member is higher in the first region than in the second region, and a concentration of the light scattering material in the light-transmissive member is higher in the second region than in the first region.

2. The light emitting device according to claim 1, wherein an average particle diameter of the light scattering material is smaller than a peak emission wavelength of the light emitting element.

3. The light emitting device according to claim 1, wherein the concentration of the fluorescent substance in the light-transmissive member is lowest at a lateral end part of the second region, and is highest at a center part of the first region.

4. The light emitting device according to claim 3, wherein the concentration of the light scattering material in the light-transmissive member is lowest at the center part of the first region, and highest at the lateral end part of the second region.

5. The light emitting device according to claim 1, wherein the second region of the light-transmissive member includes a fluorescent substance-containing portion and a fluorescent substance-free portion at a lateral side of the fluorescent substance-containing portion.

6. The light emitting device according to claim 1, wherein the light-transmissive member does not contain the fluorescent substance in the second region.

7. The light emitting device according to claim 1, wherein the light guide member does not contain the fluorescent substance.

8. The light emitting device according to claim 1, wherein the light guide member contains a fluorescent substance, and a concentration of the fluorescent substance in the light guide member is higher at a lower side than an upper side.

9. The light emitting device according to claim 1, wherein the light emitting element has a light-transmissive substrate and a semiconductor layered body, and a surface of the light-transmissive substrate constitutes the top surface of the light emitting element.

10. The light emitting device according to claim 1, further comprising electrodes at a bottom surface of the light emitting element, and constituting a portion of a bottom surface of the light emitting device.

11. The light emitting device according to claim 1, wherein the lateral surface of the light-transmissive member is covered by the light reflective member.

* * * * *